United States Patent
Kwak et al.

(10) Patent No.: US 11,897,006 B2
(45) Date of Patent: Feb. 13, 2024

(54) APPARATUS AND METHOD FOR PROCESSING SUBSTRATE

(71) Applicant: SEMES CO., LTD., Chungcheongnam-do (KR)

(72) Inventors: Ki Young Kwak, Gyeonggi-do (KR); Sang Young Kwon, Gyeonggi-do (KR); Cha Sub Shim, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/740,358

(22) Filed: May 10, 2022

(65) Prior Publication Data

US 2022/0379351 A1 Dec. 1, 2022

(30) Foreign Application Priority Data

May 26, 2021 (KR) .......................... 10-2021-0067553

(51) Int. Cl.
*B08B 3/02* (2006.01)
*B08B 3/14* (2006.01)
*B08B 3/08* (2006.01)

(52) U.S. Cl.
CPC ................ *B08B 3/022* (2013.01); *B08B 3/08* (2013.01); *B08B 3/14* (2013.01); *B08B 2203/0264* (2013.01)

(58) Field of Classification Search
CPC .. B08B 3/08; B08B 3/14; B08B 3/022; B08B 2203/0264
USPC ..................................................... 134/104.2
See application file for complete search history.

(56) References Cited

U.S. PATENT DOCUMENTS

2008/0142051 A1 6/2008 Hashizume
2018/0185886 A1* 7/2018 Kim ......................... B08B 3/04

FOREIGN PATENT DOCUMENTS

| JP | 4-107811 | 4/1992 |
|---|---|---|
| KR | 10-0594119 | 6/2006 |
| KR | 10-2008-0057145 | 6/2008 |
| KR | 10-0952035 | 4/2010 |
| KR | 10-1318510 | 10/2013 |
| KR | 10-2017-0056956 | 5/2017 |
| KR | 10-2019-0056904 | 5/2019 |

(Continued)

OTHER PUBLICATIONS

KR101318510B1—machine translation (Year: 2013).*

(Continued)

*Primary Examiner* — Tinsae B Ayalew
(74) *Attorney, Agent, or Firm* — Ladas & Parry, LLP

(57) ABSTRACT

The present disclosure provides a substrate processing apparatus and a substrate processing method. The substrate processing apparatus includes a substrate support unit configured to support a substrate, a liquid supply unit configured to supply a liquid containing any one of a chemical liquid and a cleaning liquid to the substrate supported by the substrate support unit, a processing container configured to accommodate the substrate support unit and recover the liquid supplied to the substrate from the liquid supply unit, and a capture module provided in the processing container to capture the liquid so as to suppress the liquid scattered from the substrate from being bounced back from the processing container and re-scattering.

12 Claims, 14 Drawing Sheets

(56) References Cited

FOREIGN PATENT DOCUMENTS

KR    10-2019-0097018    8/2019

OTHER PUBLICATIONS

JPH04107811A—machine translation (Year: 1992).*
Office Action for Korean Patent Application No. 10-2021-0067553 dated Mar. 2, 2023 and its English translation by Google Translate.
Office Action for Korean Patent Application No. 10-2021-0067553 dated Sep. 26, 2023 and its English translation from Global Dossier.

* cited by examiner

[FIG. 1]
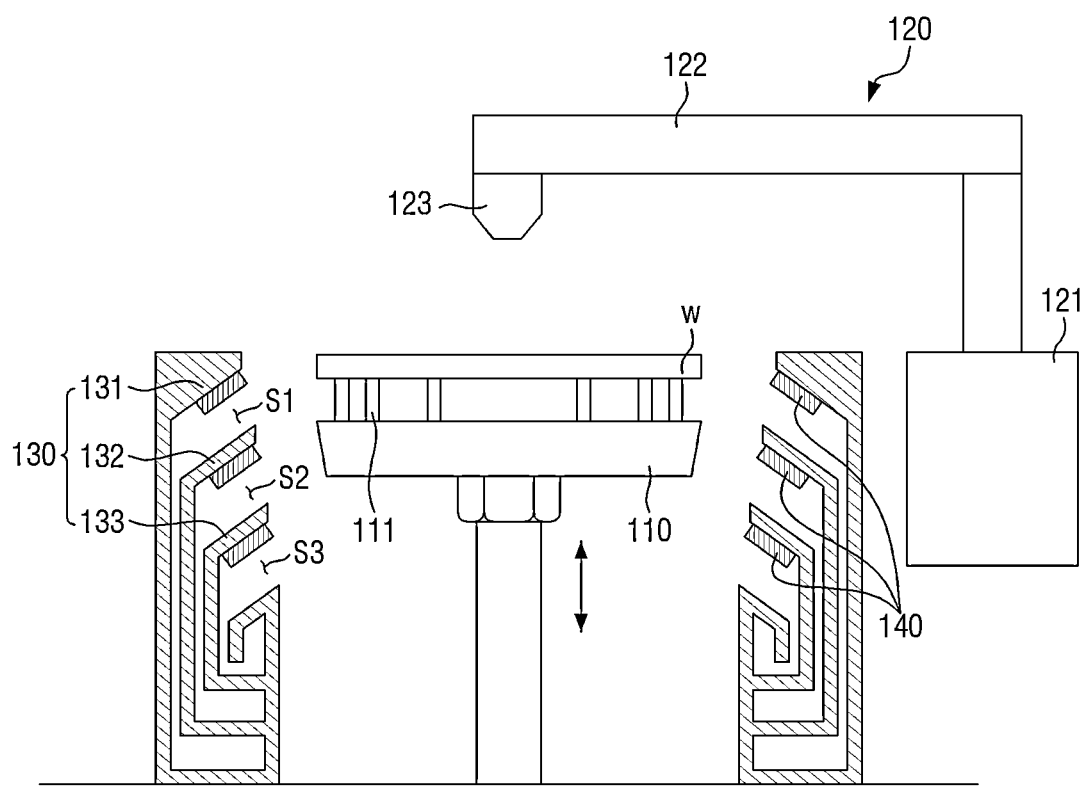

[FIG. 2]
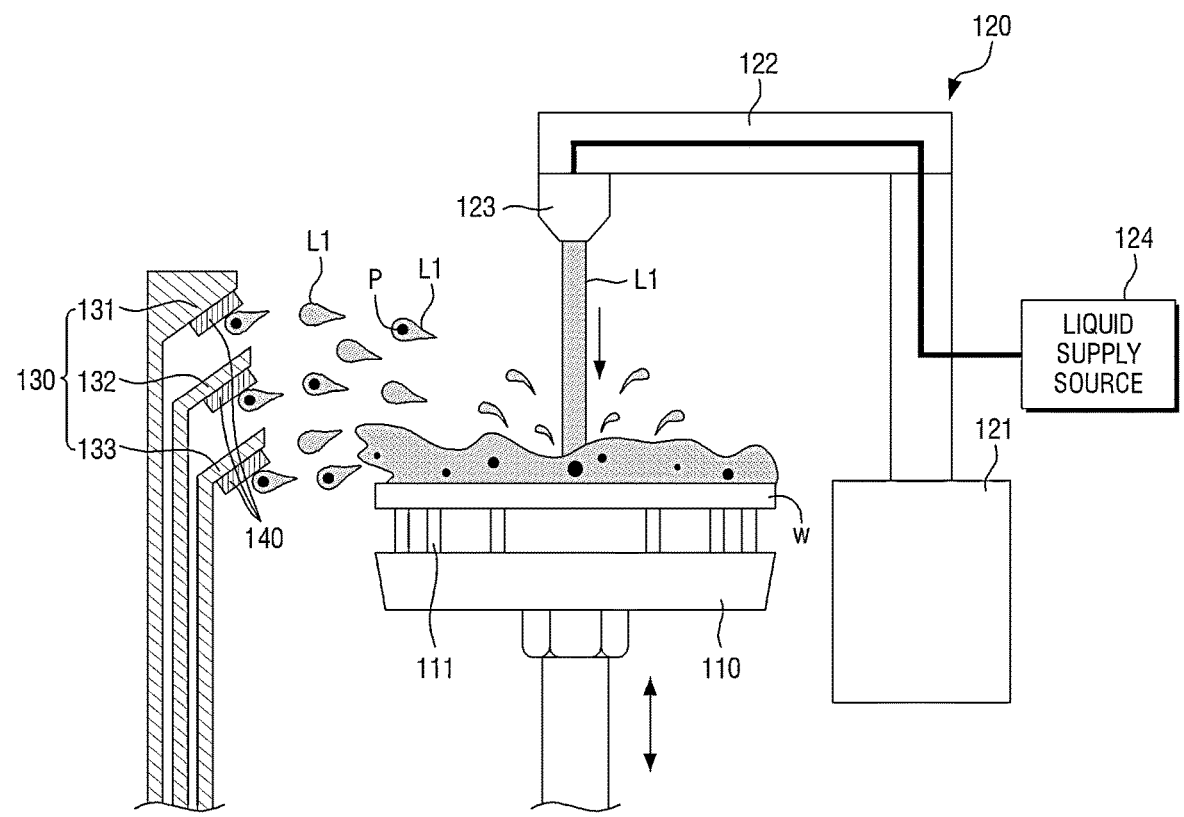

[FIG. 3]
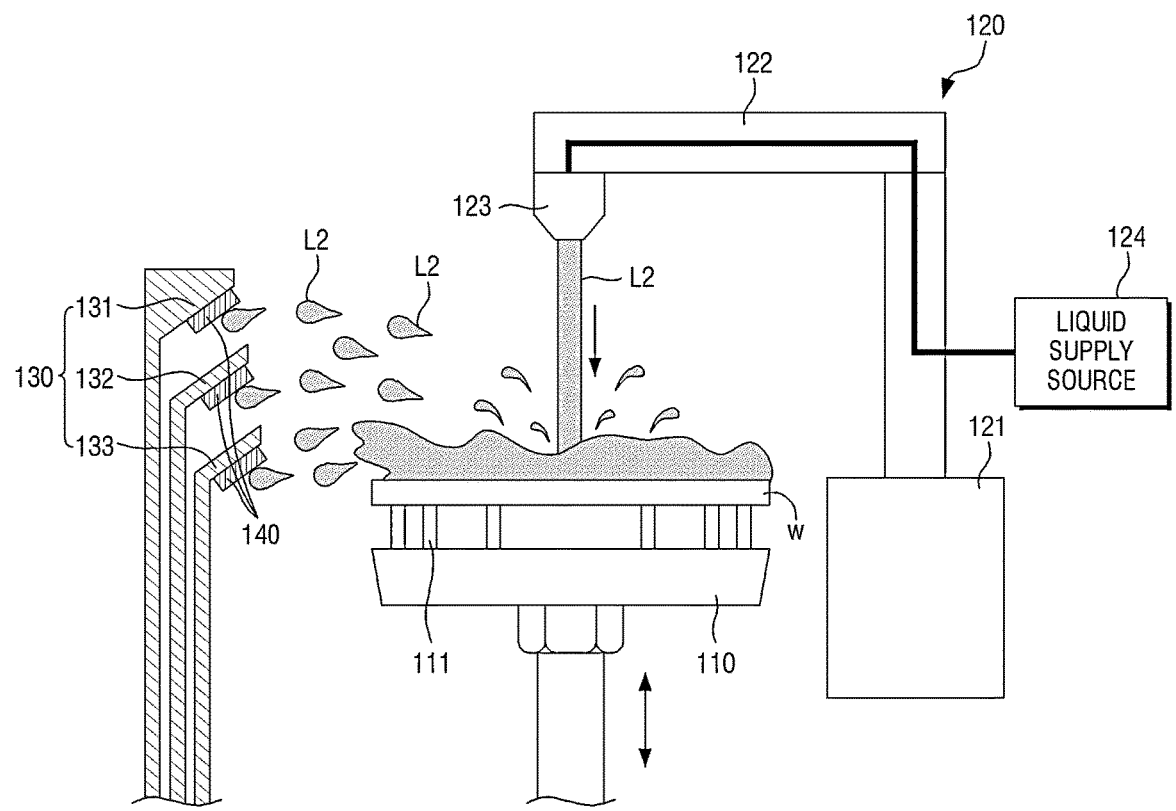

[FIG. 4]
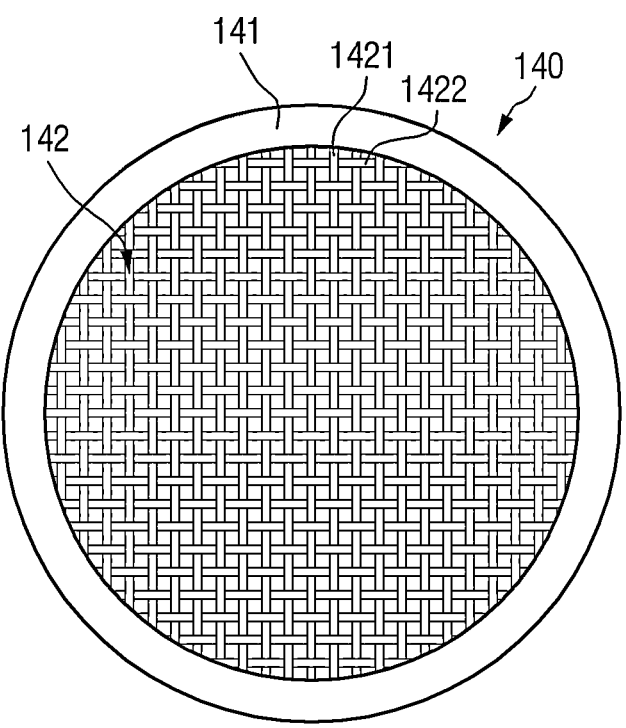

[FIG. 5]
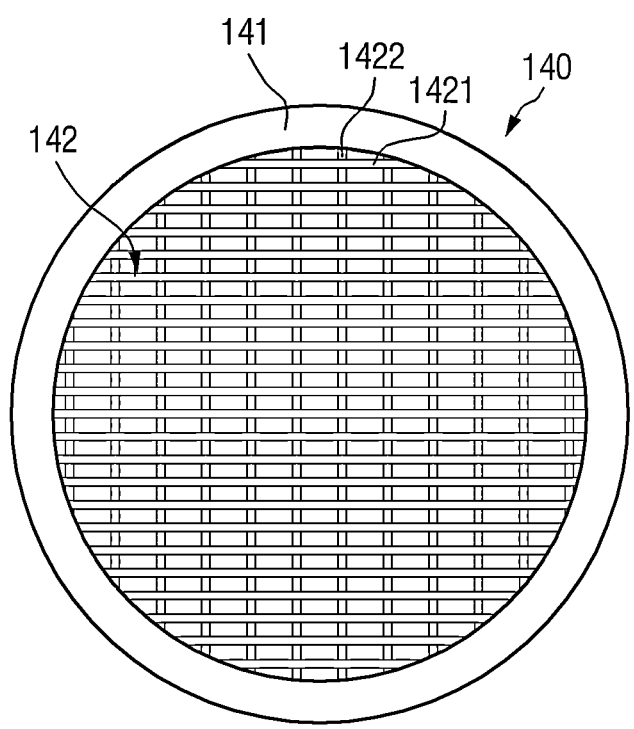

[FIG. 6]
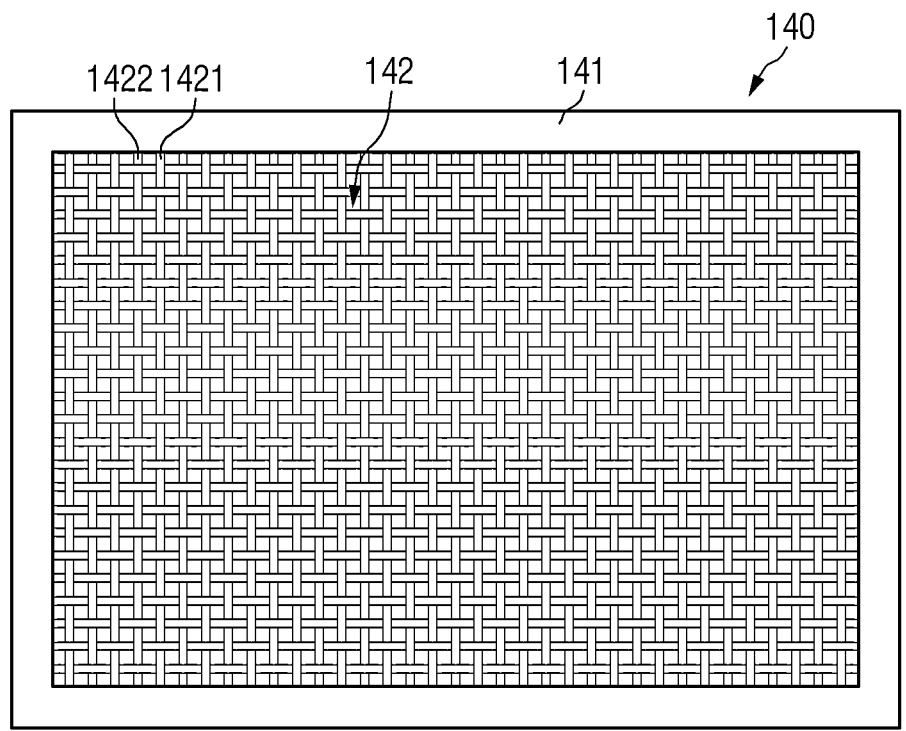

[FIG. 7]
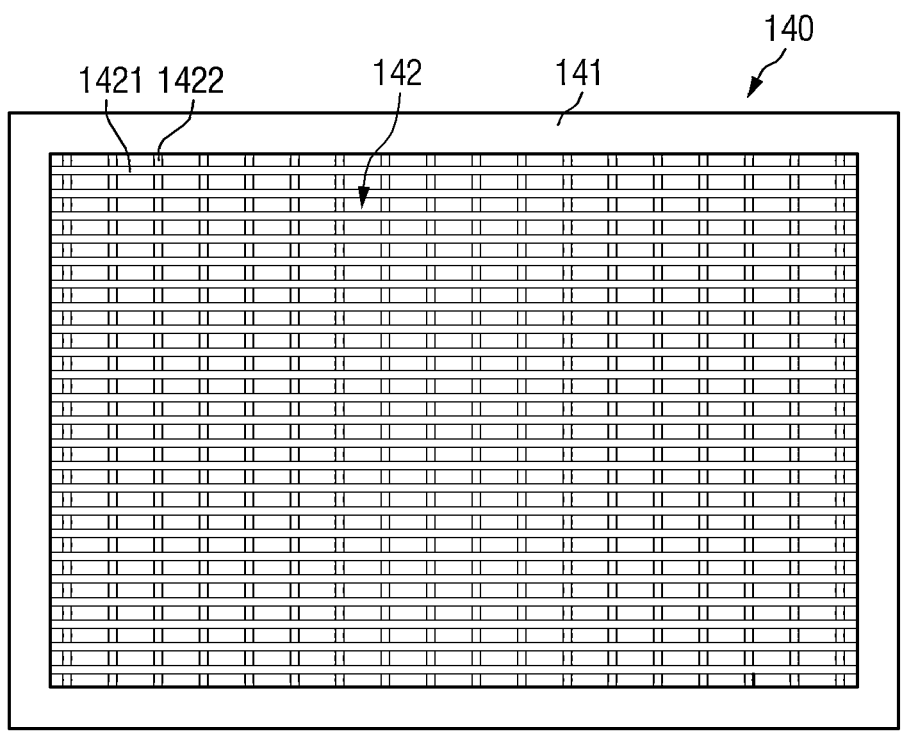

[FIG. 8]
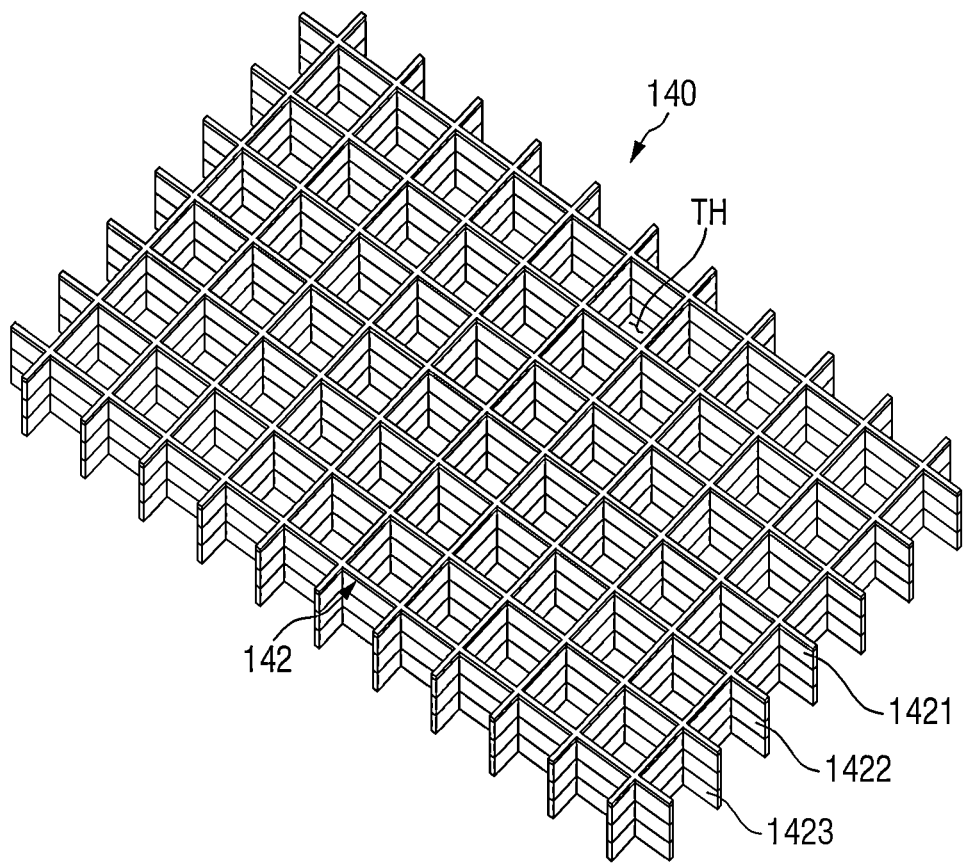

[FIG. 9]
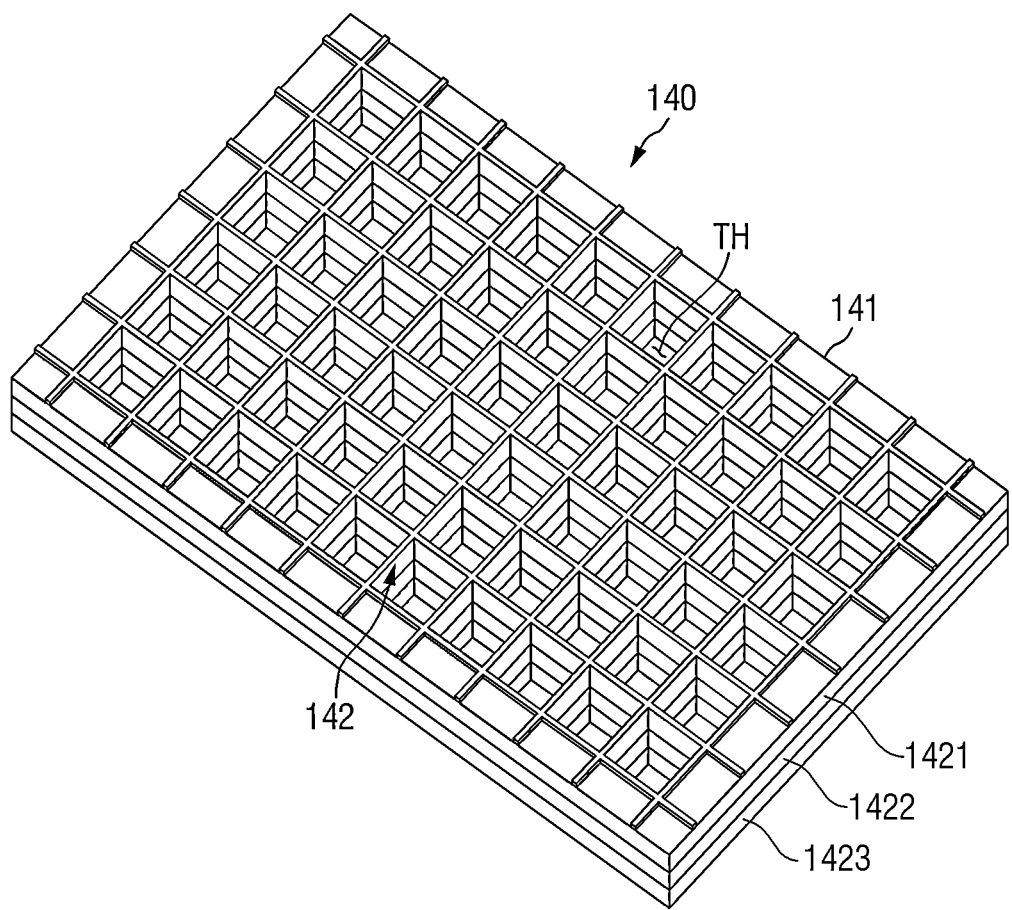

[FIG. 10]
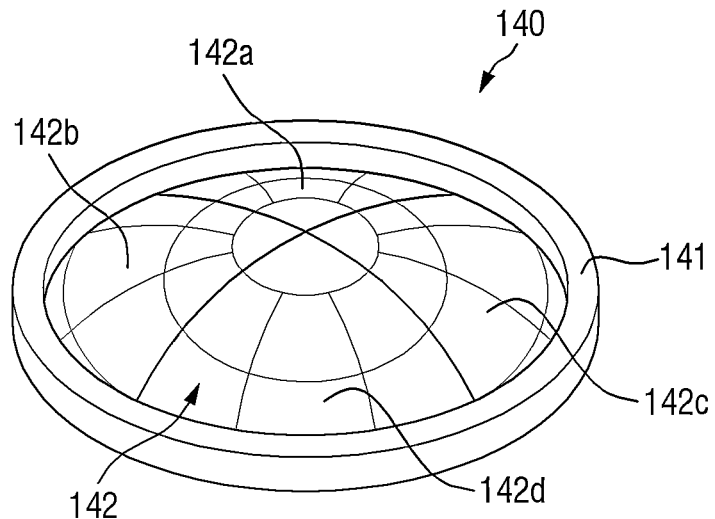
[FIG. 11]
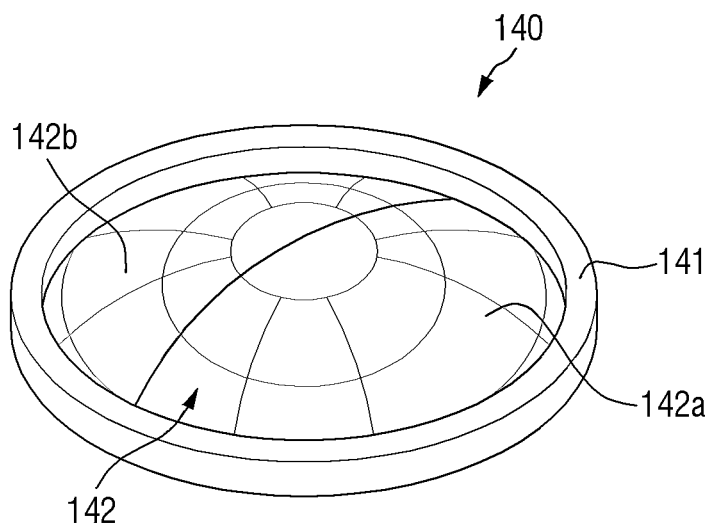

[FIG. 12]
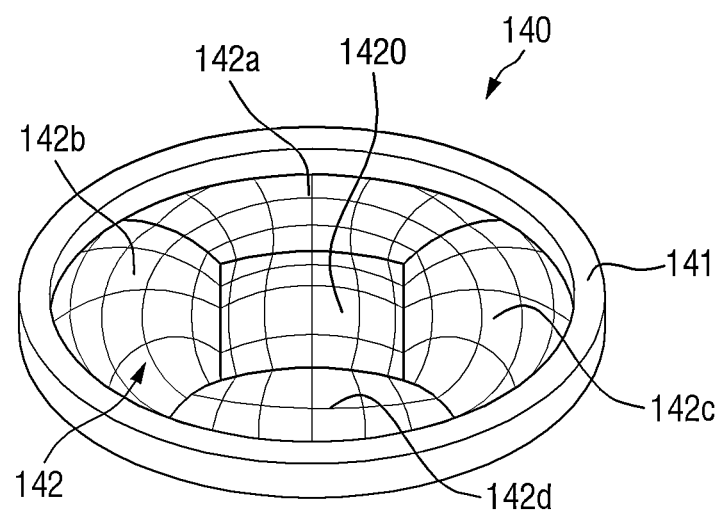

[FIG. 13]
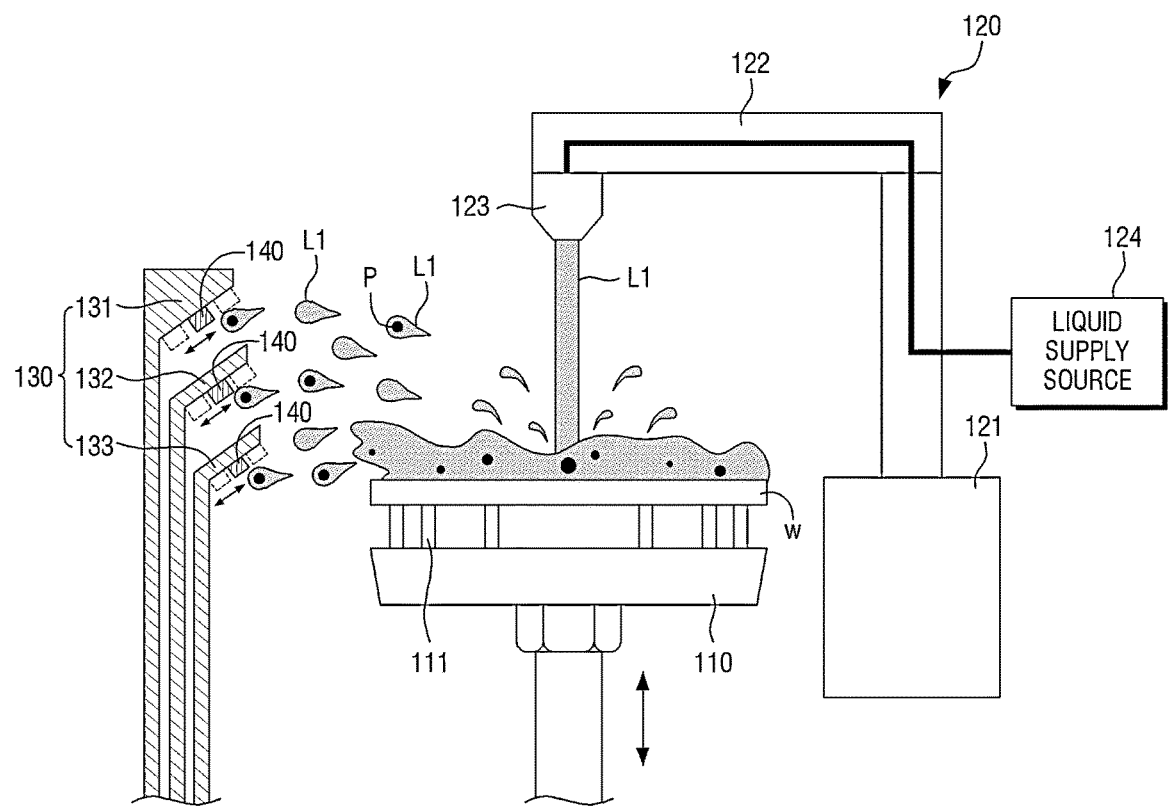

[FIG. 14]
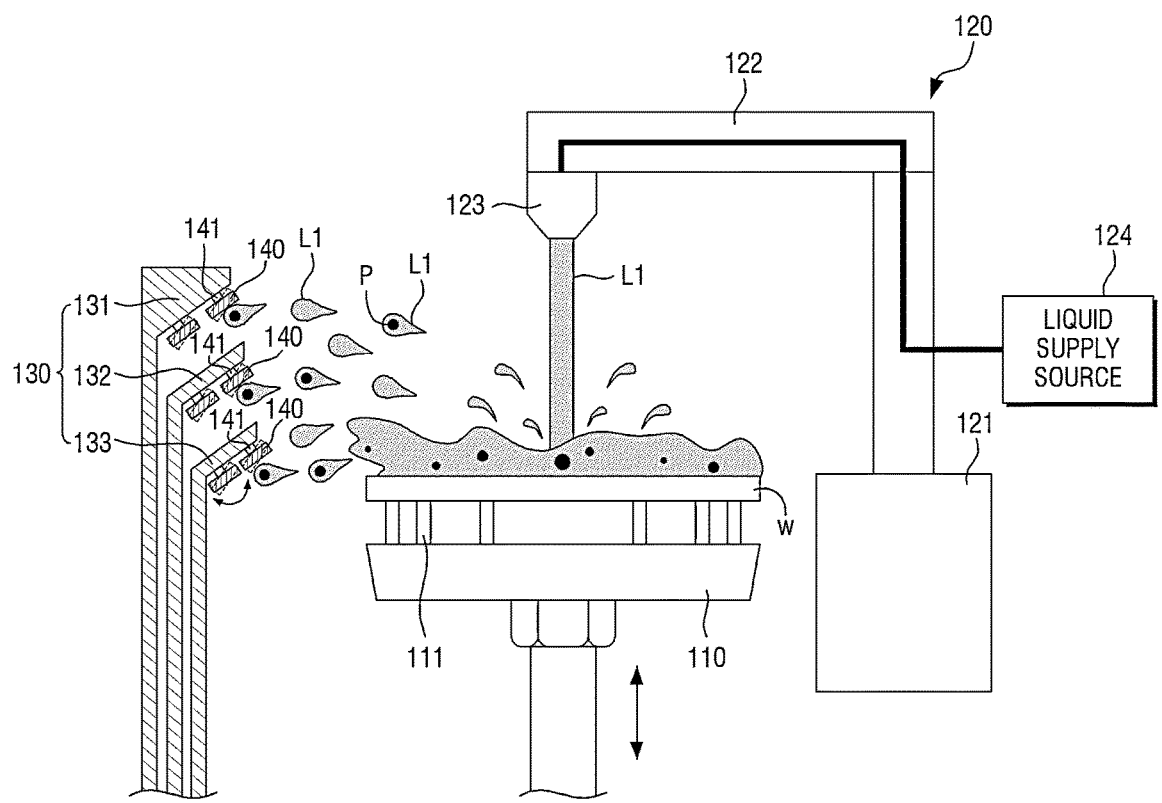

[FIG. 15]
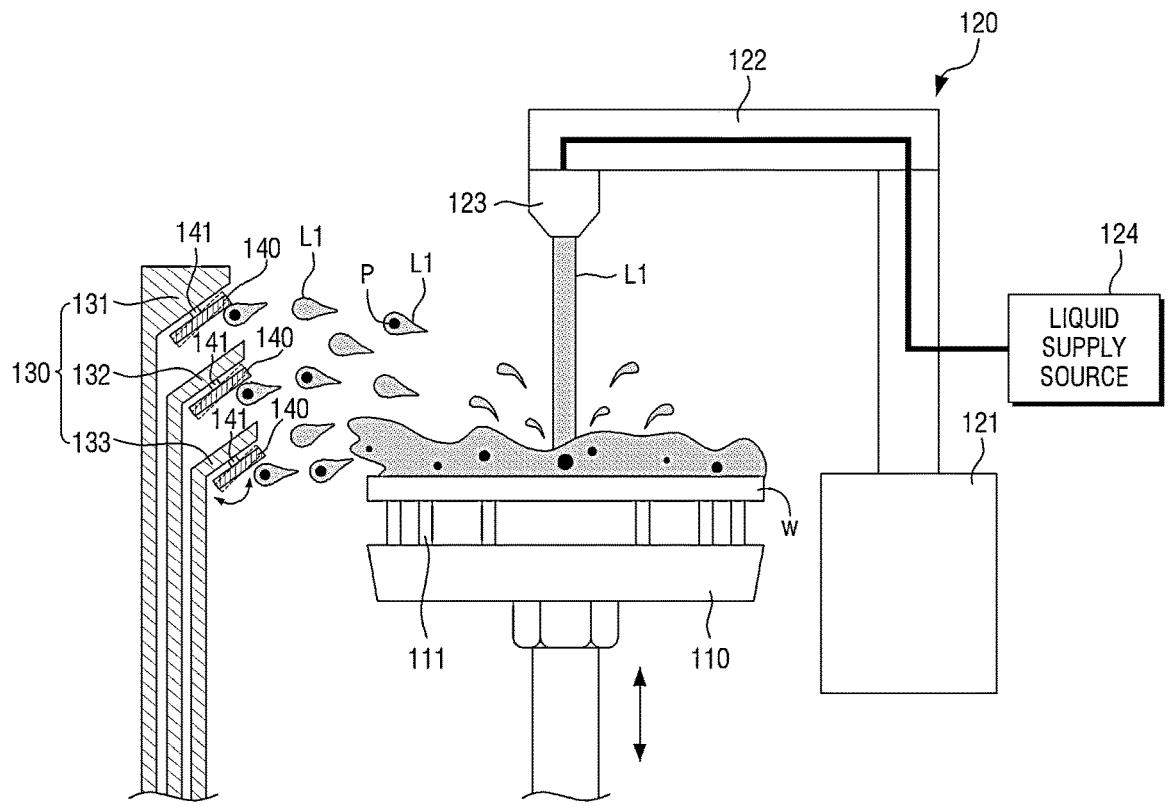
[FIG. 16]
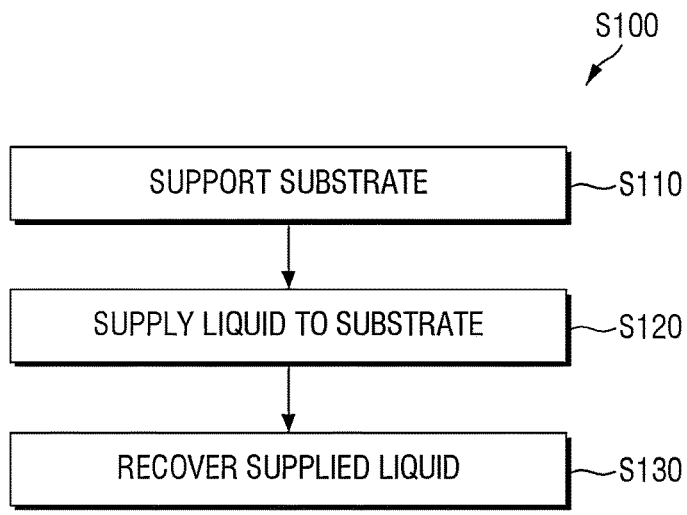

APPARATUS AND METHOD FOR PROCESSING SUBSTRATE

CROSS-REFERENCE TO RELATED APPLICATION

This application claims priority from Korean Patent Application No. 10-2021-0067553 filed on May 26, 2021 in the Korean Intellectual Property Office, and all the benefits accruing therefrom under 35 U.S.C. 119, the contents of which in their entirety are herein incorporated by reference.

BACKGROUND

1. Field of the Disclosure

The present disclosure relates to a substrate processing apparatus and a substrate processing method.

2. Description of the Related Art

In a process of processing a substrate, a process of rotating the substrate at a high speed and discharging a liquid to the rotating substrate is performed. During this process, the liquid discharged from a nozzle scatters from the substrate to the outside. Due to such scattering, there is a problem in that various contaminants contained in the liquid are diffused to unintended locations thereby causing extensive contamination and process defects in substrate processing.

SUMMARY

Aspects of the present disclosure provide a substrate processing apparatus and a substrate processing method capable of effectively controlling the scattering of a liquid from a substrate in a process of discharging the liquid to the substrate.

Aspects of the present disclosure also provide a substrate processing apparatus and a substrate processing method capable of preventing a liquid from being scattered to an unintended location by appropriately selecting an area where the liquid is scattered.

Aspects of the present disclosure also provide a substrate processing apparatus and a substrate processing method capable of simply preventing not only the scattering of a liquid but also the diffusion of contaminants contained in the scattered liquid by scattering.

Aspects of the present disclosure also provide a scattering prevention means for preventing the scattering of the scattered liquid, and a substrate processing apparatus and a substrate processing method capable of organic cleaning of the scattering prevention means itself by connecting the scattering prevention means to the process execution.

The objects of the present disclosure are not limited to the above-described objects, and other objects not mentioned will be clearly understood to those skilled in the art from the following descriptions.

In order to achieve the objects, a substrate processing apparatus according to an aspect of the present disclosure includes: a substrate support unit configured to support a substrate; a liquid supply unit configured to supply a liquid containing any one of a chemical liquid and a cleaning liquid to the substrate supported by the substrate support unit; a processing container configured to accommodate the substrate support unit and recover the liquid supplied to the substrate from the liquid supply unit; and a capture module provided in the processing container to capture the liquid so as to suppress the liquid scattered from the substrate from being bounced back from the processing container and re-scattering.

The capture module may include a mesh net structure, and capture the liquid bounced back from the processing container and scattering to the substrate.

The capture module may be positioned inside the processing container in a multi-layered form to capture the liquid.

The capture module may include a polypropylene (PP) material.

The specifications of the capture module may include a thickness in a range of 0.5 T to 1 T, and a width of at least 10 mm.

The capture module may primarily capture the chemical liquid scattered to the processing container based on the supply of the chemical liquid to the substrate by the liquid supply unit, and secondarily capture the chemical liquid scattered to the processing container based on the supply of the cleaning liquid to the substrate by the liquid supply unit, and through the secondary capture, the primarily captured chemical liquid may be cleaned.

The processing container may include a first processing container disposed on the outermost side, a second processing container configured to form a first inflow space with the first processing container, and a third processing container configured to form a second inflow space with the second processing container, and the capture module may be provided in at least any one of the first inflow space and the second inflow space to capture the inflowing liquid.

The capture module may move forward and backward in a sliding manner from an inside wall of the processing container, and may be operated in a first position adjustment mode for capturing the liquid.

The capture module may be installed to be spaced apart from the inner wall of the processing container via a connector installed on the inner wall of the processing container. The capture module may be tilted in a predetermined range on the connector, and operated in a second position adjustment mode for capturing the liquid.

A single capture module or a plurality of the capture modules may be installed on the processing container.

The cleaning liquid may include a rinse liquid, and the chemical liquid scattered from the substrate may include foreign substances cleaned from the substrate.

To achieve the object, a substrate processing method according to another aspect of the present disclosure includes supporting a substrate by a support unit; supplying a liquid to the substrate by a liquid supply unit; and recovering the liquid supplied from the substrate by a processing container, wherein the processing container may be provided with a capture module configured to capture the liquid so as to suppress the scattered liquid from being bounced back from the processing container and re-scattering to the periphery when the liquid is scattered from the rotating substrate.

BRIEF DESCRIPTION OF THE DRAWINGS

FIG. 1 is a view illustrating a substrate processing apparatus according to an exemplary embodiment of the present disclosure.

FIGS. 2 and 3 are views schematically illustrating an operating state of the substrate processing apparatus according to FIG. 1.

FIG. 3 is a view illustrating some of components of the substrate processing apparatus according to FIG. 1.

FIGS. 4 and 5 are views illustrating other aspects of some of components of the substrate processing apparatus according to FIG. 1.

FIGS. 6 and 7 are views illustrating still other aspects of some of components of the substrate processing apparatus according to FIG. 1.

FIGS. 8 and 9 are views illustrating yet other aspects of some of components of the substrate processing apparatus according to FIG. 1.

FIGS. 10 to 12 are views illustrating yet other aspects of some of components of the substrate processing apparatus according to FIG. 1.

FIG. 13 is a view illustrating a substrate processing apparatus according to another exemplary embodiment of the present disclosure.

FIG. 14 is a view illustrating a substrate processing apparatus according to still another exemplary embodiment of the present disclosure.

FIG. 15 is a view illustrating a substrate processing apparatus according to yet another exemplary embodiment of the present disclosure.

FIG. 16 is a flowchart sequentially illustrating a substrate processing method according to an exemplary embodiment of the present disclosure.

DETAILED DESCRIPTION OF THE EMBODIMENTS

Hereinafter, preferred exemplary embodiments of the present disclosure will be described in detail with reference to the accompanying drawings. Advantages and features of the present disclosure, and a method for achieving them will become apparent with reference to the exemplary embodiments to be described later in detail in conjunction with the accompanying drawings. However, the present disclosure is not limited to the embodiments to be described below, but may be provided in various different forms, and these embodiments are merely provided make the disclosure of the present disclosure complete, and to fully inform those skilled in the art of the scope of the present disclosure, and the present disclosure is only defined by the scope of the claims. The same components are denoted by the same reference numerals throughout the specification.

Spatially relative terms such as "below", "beneath", "lower", "above", and "upper" and the like may be used to easily describe the correlation between one element or components and another element or components as shown in the drawings. Spatially relative terms should be understood as terms including different orientations of elements during use or operation in addition to the orientations shown in the drawings. For example, when the elements shown in the drawing are turned over, the element described as "below" or "beneath" another element may be placed "above" another element. Therefore, the exemplary term "below" may include both downward and upward. The element may also be oriented in other directions, and therefore spatially relative terms may be interpreted depending upon the orientation.

Although first, second, etc. are used to describe various elements, components, and/or sections, it goes without saying that these elements, components, and/or sections are not limited by these terms. These terms are only used to distinguish one element, component, or section from another element, component, or section. Therefore, it goes without saying that the first element, the first component, or the first section to be described below may also be the second element, the second component, or the second section within the technical spirit of the present disclosure.

The terminology used in this specification is for the purpose of describing the exemplary embodiments and is not intended to limit the present disclosure. In this specification, the singular form also includes the plural form unless otherwise specified in the phrase. "Comprises" and/or "comprising" used in this specification means the presence or addition of one or more other components, steps, operations and/or elements other than the mentioned components, steps, operations and/or elements is not precluded.

Unless otherwise defined, all terms (including technical and scientific terms) used in this specification may be used with the meaning commonly understood to those skilled in the art to which the present disclosure pertains. Further, terms defined in a commonly used dictionary are not to be interpreted ideally or excessively unless explicitly specifically defined.

Hereinafter, exemplary embodiments of the present disclosure will be described in detail with reference to the accompanying drawings, and in describing the exemplary embodiments with reference to the accompanying drawings, the same reference numerals are assigned to the same or corresponding components regardless of reference numerals, and redundant description thereof will be omitted. Meanwhile, for convenience of explanation, it should be noted that the expressions related to the discharge and scattering of the liquid are exaggerated compared to the actual expression.

Referring to FIG. 1, a substrate processing apparatus according to an exemplary embodiment of the present disclosure includes a substrate support unit 110, a liquid supply unit 120, a processing container 130, and a capture module 140.

The liquid supply unit 120 includes a nozzle driving part 121, a nozzle arm 122, a nozzle 123, and a liquid supply source 124 (see FIG. 2). The processing container 130 includes a first processing container 131, a second processing container 132, and a third processing container 133.

Here, the substrate support unit 110 serves to support the substrate W via the substrate support means 111. The liquid supply unit 120 supplies a liquid containing either a chemical liquid L1 or a cleaning liquid L2 to the substrate W supported by the substrate support unit 110.

The nozzle driving part 121 of the liquid supply unit 120 evenly sprays fluid for processing the substrate W from the center to the edge of the substrate W. To this end, a position of the nozzle 123 is moved through the nozzle arm 122.

The processing container 130 accommodates the substrate support unit 110. In addition, the processing container 130 serves to recover the liquid supplied to the substrate W from the liquid supply unit 120. The capture module 140 is provided in the processing container 130.

The first processing container 131 of the processing container 130 is provided on the outermost side with respect to the substrate W. The second processing container 132 of the processing container 130 is provided to form a first inflow space S1 with the first processing container 131.

The third processing container 133 of the processing container 130 is provided to form a second inflow space S2 with the second processing container 132. A third inflow space S3 is also formed on the side of the third processing container 133. The capture module 140 is provided in at least one of the first inflow space S1 and the third inflow space S3 to capture (e.g., absorb moisture, capture, etc.) the inflowing liquid.

Referring to FIG. 2, the capture module 140 suppresses the liquid scattering from the substrate W from being bounced back from the processing container 130 and re-scattering. To this end, the capture module 140 includes, for example, a mesh structure for capturing the re-scattered liquid. Therefore, the capture module 140 is positioned inside the processing container 130 in a multi-layered form to capture the liquid.

Referring to FIGS. 2 and 3, the liquid discharged to the substrate W by the liquid supply unit 120 includes a chemical liquid L1 and a cleaning liquid (e.g., a rinse liquid). For example, after the chemical liquid L1, etc. is discharged to the substrate W, a rinse liquid, etc. is discharged to clean the substrate W in a post-process.

The capture module 140 primarily captures the chemical liquid L1 scattered to the processing container 130 based on the supply of the chemical liquid L1 to the substrate W by the liquid supply unit 120.

Here, the chemical liquid L1 contains a foreign material P on the substrate W due to cleaning of the substrate W. The capture module 140 captures the chemical liquid L1 along with the foreign material P contained in the chemical liquid L1 through the primary capture.

The capture module 140 secondarily captures the cleaning liquid L2 scattered to the processing container 130 based on the supply of the cleaning liquid L2 to the substrate W. In other words, the primarily captured chemical liquid L1 is naturally cleaned during the process by the secondary capture following the primary capture.

Therefore, organic cleaning of the capture module 140 is performed in the process of processing the substrate W. As a result, it is possible to omit or minimize additional cleaning management separately from the processing process of the substrate W.

Referring to FIG. 4, the capture module 140 has a circular edge portion 141 and at least a portion thereof is formed of a multi-layered mesh net 142. The structure of the mesh net 142 of the capture module 140 is provided in such a way that an upper layer 1421 and a lower layer 1422 are alternately entangled up and down with each other. The mesh net 142 is provided in a form in which the upper layer 1421 and the lower layer 1422 cross each other. At this time, of course, the edge portion 141 can be omitted.

Referring to FIG. 5, the capture module 140 is formed in multiple layers in the same manner as shown in FIG. 4, but the mesh net 142 is provided in a form in which the upper layer 1421 and the lower layer 1422 are independent and not connected to each other. At this time, the mesh net 142 is provided in a form in which the upper layer 1421 and the lower layer 1422 cross each other.

Referring to FIGS. 6 and 7, the capture module 140 has a structure corresponding to those of FIGS. 5 and 6 described above, but there is a difference in that the overall outer shape thereof is, for example, a rectangular shape. This is a factor that can affect the capture area for the liquid at the time of installation on the processing container 130 and after installation.

Referring to FIG. 9, the mesh net 142 of the capture module 140 has a multi-layered structure, but is provided in a form in which the upper layer 1421 and the lower layer 1422 are stacked without crossing each other. Here, the capture module 140 is provided in a form in which a through portion TH is formed in the central portion thereof.

Referring to FIG. 8, the capture module 140 has a form mostly similar to that of FIG. 8. However, the capture module 140 is provided in a form in which the through portion TH is formed not only in the central portion but also in the outer peripheral portion. Although FIGS. 7 and 8 show that the mesh net 142 is provided as having a total of three layers between the upper layer 1421 and the lower layer 1422, of course, it is possible to provide more than three layers.

By further stacking multiple layers of the mesh nets 1421, 1422, 1423 of the capture module 140, it is possible to facilitate the process of capturing the liquid, and at the same time, suppress the captured liquid from being scattered to the outside by colliding with the inner wall by the height of the stacked mesh nets 1421, 1422, 1423 of the capture module 140.

As described above, the number of multiple layers of the capture module 140 is adjusted in consideration of the liquid inflow space of the processing container 130 and a standard required for capturing the liquid. Of course, the capture module 140 is not limited only to the multi-layered form. At least a portion of the area of the capture module 140 in contact with the liquid is made of a polypropylene (PP) material.

Referring to FIG. 10, the capture module 140 is provided with mesh nets 1421, 1422, 1423, 1424 in the center portion thereof through the edge portion 141. At this time, the mesh nets 1421, 1422, 1423, 1424 are provided convexly upward. In addition, referring to FIG. 11, the capture module 140 is similar to the mesh net 142 of FIG. 10, but the capture module 140 is provided in a form in which the mesh nets 1421, 1422 are divided in half.

Referring to FIG. 12, the mesh net 142 of the capture module 140 is provided by being divided into a central mesh 1420 and outer meshes 142a, 142b, 142c, 142d surrounding the central mesh 1420. Here, the outer meshes 142a, 142b, 142c, 142d are provided in a convex shape, and the central mesh 1420 is provided in a convex or concave shape separately from the outer meshes 142a, 142b, 142c, 142d.

Referring to FIG. 13, the capture module 140 moves forward and backward in a sliding manner from the inner wall of the processing container 130 and is operated in a first position adjustment mode for capturing the liquid. Here, the sliding is performed manually or automatically by using an actuator, etc.

Referring to FIG. 14, the capture module 140 is installed to be spaced apart from the inner wall of the processing container 130 in a certain range through a connector 141 installed on the inner wall of the processing container 130. Here, it is preferable that the separation range be adjusted in consideration of the first inflow space S1 to the third inflow space S3, etc.

The capture module 140 is tilted in a predetermined range on the connector and is operated in a second position adjustment mode for capturing the liquid. In other words, the capture module is tilted in consideration of factors such as the angle at which the liquid is scattered, the size of the liquid, the spray pressure of the liquid supply unit 120, the spray angle, etc.

The capture module 140 is tilted by manual operation or in an automatic manner. In particular, when the capture module 140 is tilted in the automatic manner, it is tilted in a direction that maximizes the contact area with the liquid in consideration of the above factors.

Likewise, the tilt of the capture module 140 is preferably adjusted so that the degree of the movement is adjusted in consideration of the first inflow space S1 and the second inflow space S2. Here, a plurality of capture modules 140 are provided.

On the other hand, referring to FIG. 15, a single capture module 140 rather than the plurality of capture modules 140 is installed on the processing container 130. However, there is a difference in that the area of the single capture module 140 becomes wider than that of the plurality of capture modules 140.

Referring to FIG. 16, according to a substrate processing method (S100) according to an exemplary embodiment of the present disclosure, in S110, a substrate W is supported by a support unit S110. Next, in S120, a liquid is supplied to the substrate W by a liquid supply unit 120. Next, in S130, the liquid supplied from the substrate W is recovered by a processing container 130.

Here, when the liquid is scattered from the rotating substrate W, the processing container 130 suppresses the scattered liquid from being bounced back from the processing container 130 and re-scattering to the periphery. To this end, a capture module 140 for capturing the liquid is provided in the processing container 130.

As described above, according to the substrate processing apparatus and the substrate processing method in the present disclosure, there are one or more of the following effects.

The present disclosure can provide a substrate processing apparatus and a substrate processing method capable of effectively controlling the degree of scattering of the liquid by controlling the scattering of the liquid from the substrate in the process of discharging the liquid to the substrate.

Further, the present disclosure can provide a substrate processing apparatus and a substrate processing method capable of preventing the liquid from being scattered to the unintended location by appropriately selecting the area where the liquid is scattered.

Further, the present disclosure can provide a substrate processing apparatus and a substrate processing method capable of simply preventing not only scattering of the liquid but also the diffusion of contaminants contained in the scattered liquid by scattering.

Further, the present disclosure can provide a scattering prevention means for preventing the scattering of the scattered liquid, and a substrate processing apparatus and a substrate processing method capable of organic cleaning of the scattering prevention means itself by connecting the scattering prevention means to the process execution.

Although the exemplary embodiments of the present disclosure have been described with reference to the aforementioned description and the accompanying drawings, those skilled in the art to which the present disclosure pertains will understand that the present disclosure may be embodied in other specific forms without changing the technical spirit or essential features thereof. Therefore, it should be understood that the aforementioned exemplary embodiments are illustrative and not limitative in all respects.

What is claimed is:

1. A substrate processing apparatus comprising:
a substrate support unit configured to support a substrate;
a liquid supply unit configured to supply a liquid containing either a chemical liquid or a cleaning liquid to the substrate supported by the substrate support unit;
a processing container configured to accommodate the substrate support unit and recover the liquid supplied to the substrate from the liquid supply unit; and
a capture module provided in the processing container and configured to capture the liquid scattered from the substrate, the capture module configured to be movable forward and backward in a sliding manner from an inner wall of the processing container and be operated in a position adjustment mode for capturing the liquid.

2. The substrate processing apparatus of claim 1, wherein the capture module is configured to capture the liquid so as to suppress the liquid scattered from the substrate from being bounced back from the processing container and re-scattering.

3. The substrate processing apparatus of claim 1, wherein the capture module includes a mesh net structure configured to capture the re-scattered liquid.

4. The substrate processing apparatus of claim 1, wherein the capture module is located inside the processing container in a multi-layered form to capture the liquid.

5. The substrate processing apparatus of claim 2, wherein the capture module includes a polypropylene (PP) material.

6. The substrate processing apparatus of claim 2, wherein the specifications of the capture module include a thickness in a range of 0.5 T to 1 T, and a width of at least 10 mm.

7. The substrate processing apparatus of claim 1, wherein the capture module,
primarily captures the chemical liquid scattered to the processing container based on the supply of the chemical liquid to the substrate by the liquid supply unit, and
secondarily captures the cleaning liquid scattered to the processing container based on the supply of the cleaning liquid to the substrate by the liquid supply unit,
wherein
the chemical liquid primarily captured in advance is cleaned through the secondary capture.

8. The substrate processing apparatus of claim 1, wherein the processing container comprises:
a first processing container;
a second processing container configured to form a first inflow space with the first processing container; and
a third processing container configured to form a second inflow space with the second processing container,
wherein the capture module is provided in at least any one of the first inflow space and the second inflow space to capture the inflowing liquid.

9. The substrate processing apparatus of claim 1, wherein the capture module is installed to be spaced apart from an inner wall of the processing container through a connector installed on the inner wall of the processing container.

10. The substrate processing apparatus of claim 9, wherein the capture module is tilted in a predetermined range on the connector and operated in another position adjustment mode for capturing the liquid.

11. The substrate processing apparatus of claim 1, wherein the capture module is installed singly or in a plurality on the processing container.

12. A substrate processing apparatus comprising:
a substrate support unit configured to support a substrate;
a liquid supply unit configured to supply a liquid containing either a chemical liquid or a cleaning liquid to the substrate supported by the substrate support unit;
a processing container configured to accommodate the substrate support unit and recover the liquid supplied to the substrate from the liquid supply unit; and
a capture module provided in the processing container and configured to capture the liquid scattered from the substrate,
wherein the capture module is configured to capture the liquid so as to suppress the liquid scattered from the substrate from being bounced back from the processing container and re-scattering, and includes a mesh net structure for capturing the re-scattered liquid,
is located inside the processing container in a multi-layered form to capture the liquid, and is configured to primarily capture the chemical liquid scattered to the processing container based on the supply of the chemical liquid to the substrate by the liquid supply unit, and is configured to secondarily capture the cleaning liquid scattered to the processing container based on the supply of the cleaning liquid to the substrate by the liquid supply unit such that the chemical liquid primarily captured in advance is cleaned through the secondary capture, and wherein the capture module is configured to be movable forward and backward in a sliding manner from an inner wall of the processing container and be operated in a position adjustment mode for capturing the liquid.

\* \* \* \* \*